(12) United States Patent  (10) Patent No.: US 7,778,790 B2
Furuya  (45) Date of Patent: Aug. 17, 2010

(54) SEMICONDUCTOR INTEGRATED CIRCUIT DEVICE AND DELAY FAULT TESTING METHOD

(75) Inventor: Nobuo Furuya, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 639 days.

(21) Appl. No.: 11/727,743

(22) Filed: Mar. 28, 2007

(65) Prior Publication Data

US 2007/0245192 A1   Oct. 18, 2007

(30) Foreign Application Priority Data

Mar. 29, 2006  (JP)  ............................. 2006-090041

(51) Int. Cl.
 *G01R 31/28* (2006.01)
(52) U.S. Cl. ...................... 702/117; 714/726; 714/729; 714/733; 714/731; 714/738; 714/727; 714/728
(58) Field of Classification Search ................ 702/117; 365/227, 226, 222, 228, 229, 191, 193; 327/108, 327/149, 153, 158, 227; 714/726, 729, 744, 714/733, 731, 724, 728, 738
See application file for complete search history.

(56) References Cited

U.S. PATENT DOCUMENTS

| 5,450,415 | A | * | 9/1995 | Kamada ..................... 714/727 |
| 5,459,735 | A | * | 10/1995 | Narimatsu .................. 714/731 |
| 6,256,252 | B1 | * | 7/2001 | Arimoto ..................... 365/227 |
| 6,272,656 | B1 | * | 8/2001 | Yoshiyama .................. 714/733 |
| 6,625,784 | B1 | * | 9/2003 | Ohta et al. ..................... 716/4 |
| 7,243,280 | B2 | * | 7/2007 | Koganei ..................... 714/726 |
| 7,466,166 | B2 | * | 12/2008 | Date et al. .................. 327/108 |
| 7,584,393 | B2 | * | 9/2009 | Kamada et al. ............. 714/726 |
| 2002/0124218 | A1 | * | 9/2002 | Kishimoto .................. 714/726 |
| 2005/0044461 | A1 | * | 2/2005 | Ikeda et al. ................. 714/729 |
| 2005/0050412 | A1 | * | 3/2005 | Koganei ..................... 714/724 |
| 2006/0179376 | A1 | * | 8/2006 | Asaka ......................... 714/731 |
| 2006/0236179 | A1 | * | 10/2006 | Ushikubo ................... 714/726 |

FOREIGN PATENT DOCUMENTS

JP   2-028613   7/1977
JP   11-219385   8/1999

* cited by examiner

*Primary Examiner*—Carol S Tsai
(74) *Attorney, Agent, or Firm*—Foley & Lardner LLP

(57) ABSTRACT

A semiconductor integrated circuit device includes a plurality of flip-flops configured to form a scan chain in a scan path test to operate as a shift register. The first flip-flop of the plurality of flip-flops latches a first input signal in synchronization with a clock signal, outputs a first output signal and fixes the first output signal based on the first selection control signal. A second flip-flop of the plurality of flip-flops latches a second input signal in synchronization with the clock signal, outputs a second output signal, and fixes the second output signal based on a second selection control signal. The semiconductor integrated circuit device further includes a control circuit configured to generate the first and second selection control signals such that a period during which the first flip-flop fixes the first output signal is different from a period during which the second flip-flop fixes the second output signal.

12 Claims, 13 Drawing Sheets

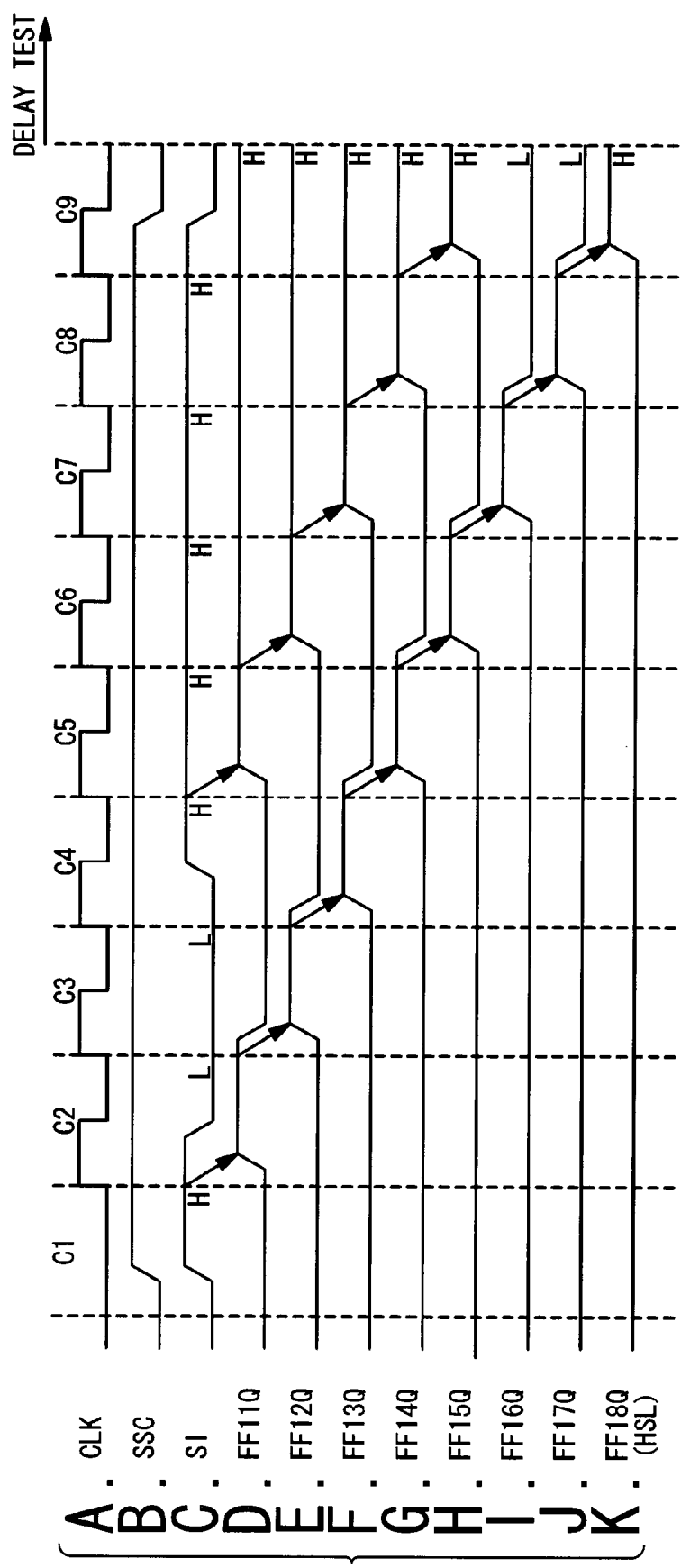

SEMICONDUCTOR INTEGRATED CIRCUIT DEVICE AND DELAY FAULT TESTING METHOD

BACKGROUND OF THE INVENTION

1. Field of the Invention

The present invention relates to a semiconductor integrated circuit device, and more particularly relates to a scan path testing circuit built in a semiconductor integrated circuit device, and a delay fault testing method that uses the scan path testing circuit.

2. Description of the Related Art

In recent years, a larger scale and higher speed of a system LSI (Large Scale Integrated Circuit) has been advanced, and in association with the miniaturization of an LSI manufacturing process to support this advancement, a manufacture defect becomes more complex, which reveals an operational error of the LSI caused due to a delay fault. For this reason, the importance of a delay fault test in the system LSI becomes higher. As a method of attaining a circuit for the delay fault test, there are several methods, and the delay fault test that uses a scan path testing circuit is widely used.

As a fault model of a delay fault that are typically known and used, there are a transition delay fault model and a path delay fault model. In the transition delay fault, it is assumed that a delay time of one gate is elongated so that a fault is caused due to an input/output terminal of the gate. In the path delay fault, it is assumed that a delay time along one path is delayed, so that a fault is caused due to a path route itself. The transition delay fault model has a merit that a test having a high coverage is possible, and the path delay fault model has a merit that a test of a critical path having a high precision is possible. The generation of a test pattern corresponding to each of the fault models is made by using software based on an ATPG (Automatic Test Pattern Generation) technique.

Also, in an internal logic of the actual system LSI, there are timing exception paths which are referred to as a false path and a multi-cycle path that the necessity is not required that the delay time between flip-flops falls in one clock cycle. In the timing exception path, usually, the delay between the flip-flops after a layout design of a semiconductor chip does not actually fall in the one clock cycle. In the delay fault test, those timing exception paths are required to be removed at the time of the test.

The method of the delay fault test that uses a scan path circuit is disclosed in, for example, Japanese Laid Open Patent Application (JP-B-Showa, 52-28613). FIG. 1 shows a circuit diagram of a circuit when the delay fault test is performed in accordance with this conventional technique example. This delay fault testing circuit contains flip-flops 11 to 17 with a scan path test function, a combination circuit 10, NAND circuits 31 to 33 and a NOR circuit 34. Hereinafter, the flip-flops 11 to 17 with the scan path test function are also referred to as flip-flops 11 to 17.

In each of the flip-flops 11 to 17, a clock signal CLK is sent to a clock terminal CK, and a scan shift control signal SSC is sent to a scan shift control terminal SC. At the time of the scan path test, the flip-flops 11 to 17 form a scan path, and an output terminal Q in a former stage is connected to a scan-in terminal DT. That is, a scan-in signal SI is supplied to the scan-in terminal DT of the flip-flop 11 from outside, and the output terminal Q is connected to the scan-in terminal DT of the flip-flop 12 in a next stage. The output terminal Q of the flip-flop 12 is connected to the scan-in terminal DT of the flip-flop 13. The output terminal Q of the flip-flop 13 is connected to the scan-in terminal DT of the flip-flop 14. The output terminal Q of the flip-flop 14 is connected to the scan-in terminal DT of the flip-flop 15. The output terminal Q of the flip-flop 15 is connected to the scan-in terminal DT of the flip-flop 16. The output terminal Q of the flip-flop 16 is connected to the scan-in terminal DT of the flip-flop 17.

An input signal is sent from the combination circuit 10 to data input terminals D of the flip-flops 11, 12 and 14 to 16. The two input terminals of the NAND circuit 31 are connected to the output terminals Q of the flip-flops 11 and 12, and the output terminal of the NAND circuit 31 is connected to the data input terminal D of the flip-flop 13. The two input terminals of the NAND circuit 32 are connected to the output terminals Q of the flip-flops 13 and 14, and the output terminal of the NAND circuit 32 is connected to the input terminal of the NOR circuit 34. The two input terminals of the NAND circuit 33 are connected to the output terminals Q of the flip-flops 15 and 16, and the output terminal of the NAND circuit 33 is connected to the input terminal of the NOR circuit 34. The output terminal of the NOR circuit 34 is connected to the data input terminal D of the flip-flop 17. At the time of the scan path test, a scan-out signal SO is outputted from the output terminal Q of the flip-flop 17 to outside.

Each of the flip-flops 11 to 17 with the scan path test function contains a D-type flip-flop 101 and a selecting circuit 102, as shown in FIG. 13A. The selecting circuit 102 selects one of a signal supplied to a data input terminal D and a scan-in terminal DT in response to a signal supplied to a scan shift control terminal SC, and receives the selected signal to the D-type flip-flop 101. The D-type flip-flop 101 latches a data in synchronization with the rising edge of a clock signal supplied to the clock terminal CK. Thus, when the scan shift control terminal SC is in an "H" level, the signal level of the scan-in terminal DT is latched, and when it is at an "L" level, the signal level of the data input terminal D is latched.

Next, the operation of the circuit will be described below with reference to FIGS. 2A to 2J and FIGS. 3A to 3S. FIGS. 2A to 2J are timing charts showing the operation for setting a test data to the flip-flops 11 to 17. At a clock cycle C1, the scan shift control signal SSC is set to the "H" level (FIG. 2B), and a scan shift is started. At this time, the flip-flops 11 to 17 act as a shift register. Thus, the data set between the clock cycles C2 and C8 are sequentially sent to the flip-flops 11 to 17. In FIGS. 2A to 2J, the delay fault test for the path from the flip-flop 13 to the flip-flop 17 is assumed. The shift-in signal SI includes a serial data "LHHHLLL" (FIG. 2C), and the flip-flops 11 to 17 are set in "L", "L", "L", "H", "H", "H" and "L", respectively (FIGS. 2D to 2J).

After that, as shown in FIGS. 3A to 3S, the delay fault test is performed. In FIGS. 3A to 3S, a time axis is enlarged. A delay time td where the clock cycle C11 is defined is indicated. That is, it is checked that in synchronization with the rising edge of the clock cycle C11, the state of each flip-flop is changed and until of the rising edge of the clock cycle C12, a signal indicating a calculation result of the combination circuit arrives at each flip-flop. The time td of this clock cycle C11 is set to satisfy a desirable test standard (FIG. 3A).

At the clock cycle C9, since the flip-flops 11 to 17 output "L", "L", "L", "H", "H", "H" and "L" from the output terminals Q, the output of the NAND circuit 31 is set to "H", the output of the NAND circuit 32 is set to "H", and the output of the NAND circuit 33 is set to "L" (FIGS. 3H, 3L and 3Q). The output of the NOR circuit 34 is in "L" (FIG. 3R). Here, the scan shift control signal SSC is set to "L", and the flip-flops 11 to 17 are set to the states at which in synchronization with the clock signal CLK, the signals supplied to the data input terminals D are latched and held.

In the clock cycle C11, in synchronization with the rising edge of the clock signal CLK, the flip-flops 11 to 17 latches signals supplied to the data input terminals D. The flip-flop 11 latches "L" outputted from the combination circuit 10, and the flip-flops 12, 14 to 16 latches an "H" state outputted from the combination circuit 10. However, because of the same level as the clock cycle C9, the output signals are not changed. Since the NAND circuit 31 outputs the "H" level, the flip-flop 13 is changed from "L" to "H" (FIG. 3I). Thus, the output of the NAND circuit 32 is changed from "H" to "L" (FIG. 3L). When the output of the NAND circuit 32 becomes "L", the NOR circuit 34 is changed to "H" because both of the inputs become "L" (FIG. 3R).

In the clock cycle C12, since the scan shift control signal SSC is in "L", the flip-flops 11 to 17 latch the signal levels supplied to the data input terminals D. That is, the result of the delay fault test is latched by each flip-flop. The flip-flop 17 latches "H" outputted by the NOR circuit 34 and outputs it. Therefore, in the path from the flip-flop 13 to the flip-flop 17, the fact that the signal level in the period td of the clock cycle C11 is changed can be checked, and the satisfaction with the standard is known.

In the clock cycle C13, the scan shift control signal SSC becomes "H". Then, the flip-flops 11 to 17 form a shift register and carry out the shifting operation. On and after the clock cycle C14, the states held in the flip-flops 11 to 17 are read out to an external terminal of the LSI, and the test result is determined.

In this way, the delay fault test is performed. However, for example, when the path from the flip-flop 13 to the NAND circuit 32 has a very long delay time, as indicated by the dotted lines in FIGS. 3A to 3S, the change in the output of the NAND circuit 32 is delayed (FIG. 3L), and the change in the output of the NOR circuit 34 is delayed (FIG. 3R). When a delay from a period td of the clock cycle C11 is present, the flip-flop 17 cannot latch the change in the output of the NOR circuit 34, and this results in an error in the delay fault test.

Usually, the delay of the path of the combination circuit portion in the circuit is required to fall in one clock cycle. However, in the case of the timing exception path where a timing restriction is relaxed, the delay is not restricted to one clock cycle. That is, the foregoing delay time td is not supplied to the timing exception path. When this route from the flip-flop 13 through the NAND circuit 32 and the NOR circuit 34 to the flip-flop 17 is the timing exception path, the signals of the timings indicated by the dotted lines in FIGS. 3A to 3S are observed in spite of the normal operations, and the delay faults are detected.

When the transition delay fault model is used to generate a test pattern for the delay fault test, the ATPG program generates a data to detect the delay fault of the NAND circuit 32, and the fact that the NAND circuit 32 is located on the route of the timing exception path is not recognized. For this reason, the test pattern through the timing exception path is generated, and the fault is detected in the delay fault test of the actual LSI. Thus, the LSI does not pass through the delay fault test.

For the generated test pattern, it is considered to perform a masking process in consideration of the influence of the timing exception path. However, in the test pattern of the large LSI, the individual study is not practical. Thus, in order to avoid this situation, when the ATPG program is executed, it is necessary to set a mask for the output of the flip-flop 17 serving as the final flip-flop of the timing exception path and then generate the test pattern. However, this mask setting is for the path arriving at the flip-flop 17. Consequently, the test result of the route from the flip-flop 16 through the NAND circuit 33 and the NOR circuit 34 to the flip-flop 17 is masked which is the non-timing exception path. Therefore, the delay fault detection of the usual path route where the timing exception path and the final flip-flop are same cannot be performed, which reduces a delay fault detection rate of the transition delay fault model.

As the method of the delay fault test in which the foregoing method is improved, a technique disclosed in Japanese Laid Open Patent Application (JP-A-Heisei, 11-219385) is known. FIG. 4 shows a circuit diagram of a delay fault testing circuit according to this conventional example. The circuit contains flip-flops 11, 12, 17, 18 and 23 to 26, a combination circuit 10, NAND circuits 31 to 33 and a NOR circuit 34. This circuit is approximately similar to the circuit shown in FIG. 1. However, the flip-flops 13 to 15 are replaced by the flip-flops 23 to 25 with the scan path test function having a normal signal selection holding function, and the flip-flop 16 is replaced by the flip-flop 26 with the scan path test function having an inversion signal holding function, and the flip-flop 18 is added.

In each of the flip-flops 11, 12, 23 to 26, 17 and 18, the clock signal CLK is sent to a clock terminal CK, and a scan shift control signal SSC is sent to a scan shift control terminal SC. At the time of the scan path test, these flip-flops form the scan path, and the output terminal Q in the former stage is connected to the scan-in terminal DT. That is, the scan-in signal SI is supplied to the scan-in terminal DT of the flip-flop 11 from outside, and the output terminal Q is connected to the scan-in terminal DT in the flip-flop 12 of the next stage. The output terminal Q of the flip-flop 12 is connected to the scan-in terminal DT of the flip-flop 23. The output terminal Q of the flip-flop 23 is connected to the scan-in terminal DT of the flip-flop 24. The output terminal Q of the flip-flop 24 is connected to the scan-in terminal DT of the flip-flop 25. The output terminal Q of the flip-flop 25 is connected to the scan-in terminal DT of the flip-flop 26. The output terminal Q of the flip-flop 26 is connected to the scan-in terminal DT of the flip-flop 17. The output terminal Q of the flip-flop 17 is connected to the scan-in terminal DT of the flip-flop 18.

An input signal is sent from the combination circuit 10 to the data input terminals D of the flip-flops 11, 12 and 24 to 26. The two input terminals of the NAND circuit 31 are connected to the output terminal Q of the flip-flop 11 and the output terminal Q of the flip-flop 12, and the output terminal of the NAND circuit 31 is connected to the data input terminal D of the flip-flop 23. The two input terminals of the NAND circuit 32 are connected to the output terminals Q of the flip-flops 23 and 24, and the output terminal of the NAND circuit 32 is connected to the input terminal of the NOR circuit 34. The two input terminals of the NAND circuit 33 are connected to the output terminals Q of the flip-flops 25 and 26, and the output terminal of the NAND circuit 33 is connected to the input terminal of the NOR circuit 34. The output terminal of the NOR circuit 34 is connected to the data input terminal D of the flip-flop 17. At the time of the scan path test, a scan-out signal SO is outputted from the output terminal Q of the flip-flop 17 to outside. The "L" level is always supplied to the data input terminal D of the flip-flop 18, and the output terminal Q is connected to normal signal selection holding control terminals HD of the flip-flops 23 to 25 and an inversion signal selection holding control terminal RV of the flip-flop 26.

As for the flip-flops 11, 12, 17 and 18, as explained above, FIG. 13A shows their internal configuration. Each of the flip-flops 23 to 25 with the scan path test function having the normal signal holding function contains a D-type flip-flop 111 and selecting circuits 112 and 113, as shown in FIG. 13B.

The selecting circuit 113 selects one of a signal to be supplied to the scan-in terminal DT in response to a signal supplied to the normal signal selection holding control terminal HD, and the output signal of the D-type flip-flop and outputs to the selecting circuit 112. The selecting circuit 112 selects one of the signal to be supplied to the data input terminal D and an output signal of the selecting circuit 113 for outputting the test data response to the signal supplied to the scan shift control terminal SC, and outputs to the D-type flip-flop 111. The D-type flip-flop 111 latches the data in synchronization with the rising edge of the clock signal supplied to the clock terminal CK. Thus, in the flip-flop with the scan path test function having the normal signal holding function, when the scan shift control terminal SC is in the "L" level, the signal supplied to the data input terminal D is latched, and when the scan shift control terminal SC is in "H" and the normal signal selection holding control terminal HD is in "L", the signal supplied to the scan-in terminal DT is latched. When the scan shift control terminal SC is in "H" and the normal signal selection holding control terminal HD is in "H", the output signal of the D-type flip-flop 111 is latched in synchronization with the clock signal CK. That is, when the scan shift control terminal SC is in "H" and the normal signal selection holding control terminal HD is in "H", the output of the flip-flop with the scan path test function having the normal signal holding function is not changed.

The flip-flop 26 with the scan path test function having the normal signal holding function contains a D-type flip-flop 121, selecting circuits 122, 123 and an inverter circuit 124, as shown in FIG. 13C. The selecting circuit 123 responses to the signal supplied to the inversion signal selection holding control terminal RV, selects any of the signal to be supplied to the scan-in terminal DT and the inversion signal of the output signal of the D-type flip-flop connected through the inverter circuit 124 and outputs to the selecting circuit 122. The selecting circuit 122 responses to the signal supplied to the scan shift control terminal SC, selects the signal supplied to the data input terminal D or the output signal of the selecting circuit 123 for outputting the test data and outputs to the D-type flip-flop 121. The D-type flip-flop 121 latches the data in synchronization with the rising edge of the clock signal supplied to the clock terminal CK. Thus, in the flip-flop with the scan path test function having the normal signal holding function, when the scan shift control terminal SC is at the "L" level, the signal supplied to the data input terminal D is latched, and when the scan shift control terminal SC is in "H" and the inversion signal selection holding control terminal RV is in "L", the signal supplied to the scan-in terminal DT is latched, and when the scan shift control terminal SC is "H" and the inversion signal selection holding control terminal RV is in "H", the inversion signal of the output signal of the D-type flip-flop 121 is latched, respectively, in synchronization with the clock signal CK. That is, when the scan shift control terminal SC is the "H" and the normal signal selection holding control terminal HD is in "H" and when the clock signal rises, the output of the flip-flop with the scan path test function having the inversion signal holding function is inverted.

The operation of the circuit will be described below with reference to FIGS. 5A to 5U. The operation for setting the test data for each flip-flop is the operation of the shift register as shown in FIG. 2. Thus, the detailed explanation is omitted. As shown in FIGS. 5A to 5U, the data set to carry out the delay fault test is "HHHHLLH". The scan-in signal SI gives "HLLHHHHH" in synchronization with the clock signal CLK in the period while the scan shift control signal SSC is in "H". Thus, in the clock cycle C9, the flip-flops 11, 12, 23, 24, 25 and 18 hold the "H" level (FIGS. 5E, 5G, 5I, 5K, 5N and 5U), and the flip-flops 26, 17 hold the "L" level (FIGS. 5P, 5S).

The flip-flop 18 outputs "H" (FIG. 5U). Thus, in the clock cycle C11, even if the clock signal CLK rises, the respective outputs of the flip-flops 23 to 25 with the scan path test function having the normal signal holding function are not changed (FIGS. 5I, 5K and 5N). On the other hand, in the flip-flop 26 with the scan path test function having the inversion signal holding function, its output is inverted (FIG. 5P). That is, in accordance with the change in the output of the flip-flop 26 with the scan path test function having the inversion signal holding function, the delay fault test is performed. Even if the path from the flip-flop 23 to the flip-flop 17 is the timing exception path, the output of the flip-flop 23 is not changed. Therefore, this has no influence on the delay fault test.

In this way, in accordance with the route delay fault model, in order that the delay fault test of the route from the flip-flop 26 through the NAND circuit 33 and the NOR circuit 34 to the flip-flop 17 is made easier, the flip-flops 23 to 25 are replaced with the flip-flop with the scan path test function having the normal signal holding function, and the flip-flop 26 is replaced with the flip-flop with the scan path test function having the inversion signal holding function. For this reason, the route from the flip-flop 23 with the scan path test function having the normal signal holding function through the NAND circuit 32 and the NOR circuit 34 to the flip-flop 17 is not activated at the time of the delay fault test. Thus, when the test pattern is generated in accordance with the transition delay fault model, the mask setting is not required to be performed on the output of the flip-flop 17 in the ATPG program. However, the start flip-flop of the different route to the final flip-flop on the route targeted for the route delay fault test is replaced by the flip-flop with the holding function. Thus, the delay fault cannot be detected. In the case of the example in FIG. 4, the delay fault test cannot be performed on the route from the flip-flop 23 to the flip-flop 17, the route from the flip-flop 24 to the flip-flop 17 and the route from the flip-flop 25 to the flip-flop 17. Moreover, the flip-flop 23 is the flip-flop having the normal signal holding function at the time of the delay fault test. Thus, with regard to the route from the flip-flop 12 to the flip-flop 23 and the route from the flip-flop 11 to the flip-flop 23, the delay fault cannot be detected in accordance with the transition delay fault model. Therefore, even in this method, the delay fault detection rate based on the transition delay fault model is decreased.

As mentioned above, in the LSI in which the scale is made larger and the speed is made higher, it is important to increase the inclusion degree of the fault detection by using the delay fault test in which not only the route delay fault test for preferentially testing the critical path but also the transition delay fault test are combined. However, the conventional delay fault testing circuit could not attain this.

SUMMARY OF THE INVENTION

In an aspect of the present invention, a semiconductor integrated circuit device includes a plurality of flip-flops configured to form a scan chain in a scan path test to operate as a shift register. The first flip-flop of the plurality of flip-flops latches a first input signal in synchronization with a clock signal, outputs a first output signal and fixes the first output signal based on the first selection control signal. A second flip-flop of the plurality of flip-flops latches a second input signal in synchronization with the clock signal, outputs a second output signal, and fixes the second output signal based on a second selection control signal. The semiconductor integrated circuit device further includes a control circuit configured to generate the first and second selection control signals such that a period during which the first flip-flop fixes the first output signal is different from a period during which the second flip-flop fixes the second output signal.

Here, the semiconductor integrated circuit device may further include a first selecting circuit configured to select one of the first output signal and a first combination signal outputted from a combination circuit based on the first selection control signal and to output the selected signal to the first flip-flop as the first input signal; and a second selecting circuit configured to select one of the second output signal and a second combination signal outputted from the combination circuit based on the second selection control signal and to output the selected signal to the second flip-flop as the second input signal.

Also, a signal route from an output of the first flip-flop to an input of the second flip-flop may be a timing exception path which is not necessary for a delay time to fall within a one clock cycle of the clock signal.

Also, the control circuit may generate the first and second selection control signals based on a test execution signal indicating that a delay fault test is executed to detect a delay fault.

Also, the control circuit may determine whether the first flip-flop inputs the first output signal or the second flip-flop inputs the second output signal, based on an external hold control signal, and generate the first and second selection control signal.

Also, the scan chain of the plurality of flip-flops may include a third flip-flop configured to output the hold control signal. In this case, a test data supplied to the scan chain is set in the third flip-flop and contains a data showing the hold control signal.

In another aspect of the present invention, a delay fault test method is achieved by forming a scan chain from a plurality of flip-flops in a scan path test to operate as a shift register; by holding a first output signal of a first flip-flop of the plurality of flip-flops in response to a first selection control signal; by holding a second output signal of a second flip-flop of the plurality of flip-flops in response to a second selection control signal; and by generating the first and second selection control signals such that a period during which the first flip-flop fixes the first output signal is different from a period during which the second flip-flop fixes the second output signal. A delay fault is tested by supplying a test data to the scan chain.

Here, the plurality of flip-flops operate in synchronization with a clock signal. The delay fault test method may be achieved by further setting a start point flip-flop of a timing exception path in a signal route set to the plurality of flip-flops to the first flip-flop; wherein the timing exception path is not necessary for a delay time when a signal is transferred on the signal route to fall within one clock cycle of the clock signal; and by setting an end point flip-flop of the timing exception path to the second flip-flop.

Also, the generating the first and second selection control signals may be achieved by generating the first and second selection control signals based on a test execution signal indicating that a delay fault test is executed to detect a delay fault.

Also, the generating the first and second selection control signals may be achieved by validating the first selection control signal or the second selection control signal based on a hold control signal.

Also, the generating the first and second selection control signals may be achieved validating the first selection control signal or the second selection control signal based on the test data.

According to the present invention, it is possible to provide the delay fault testing circuit for testing the delay fault without any drop in the delay fault detection rate and the method of testing the same.

BRIEF DESCRIPTION OF THE DRAWINGS

FIGS. 12A to 12K are timing charts showing an operation of the delay fault testing circuit according to the second embodiment of the present invention in setting the test data.

DESCRIPTION OF THE PREFERRED EMBODIMENTS

Hereinafter, a semiconductor integrated circuit device of the present invention will be described in detail with reference to the attached drawings.

First Embodiment

Figure 1:
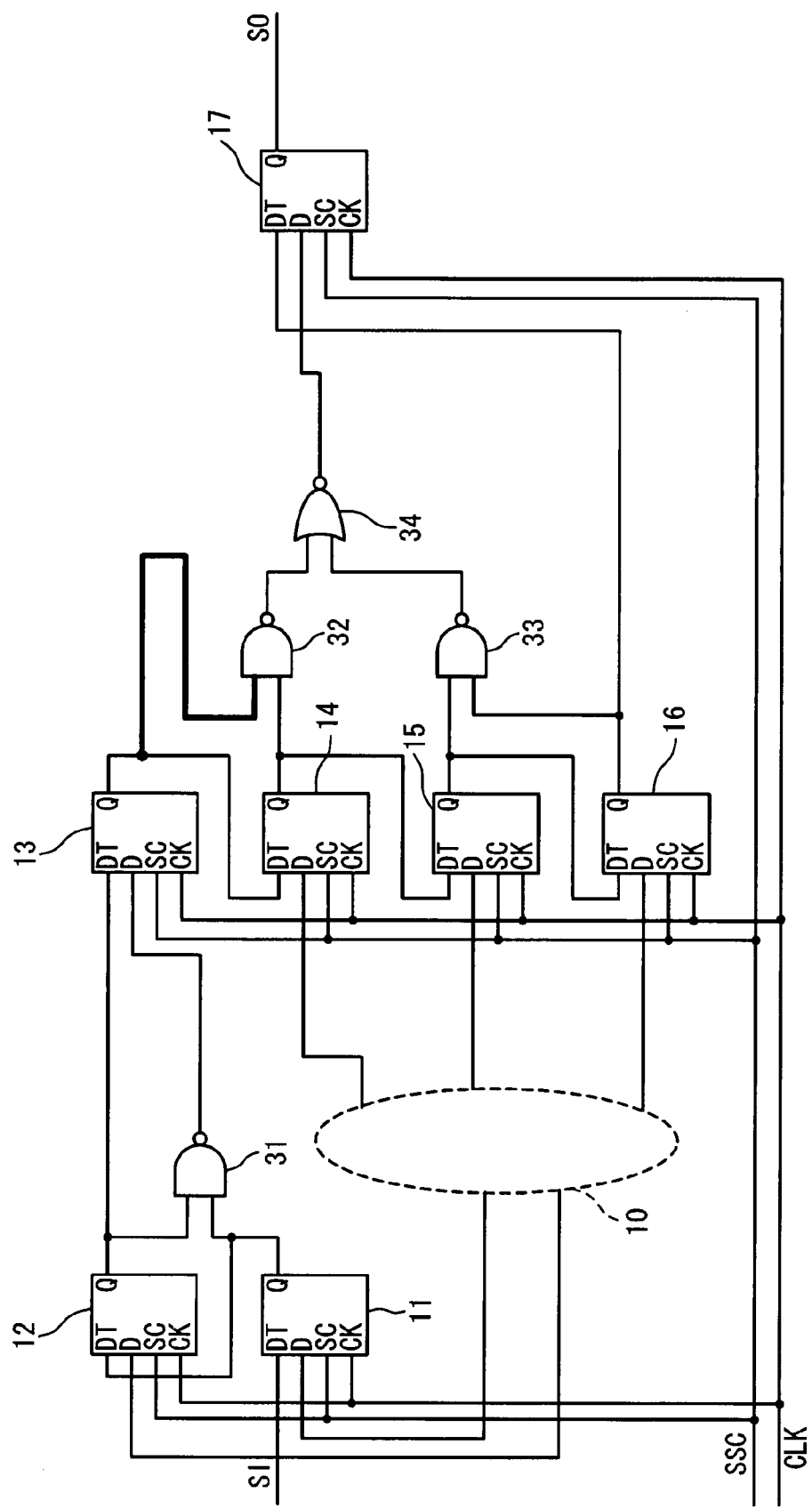
FIG. 1 is a circuit diagram showing a semiconductor integrated circuit having a conventional delay fault testing circuit.
Figure 2:
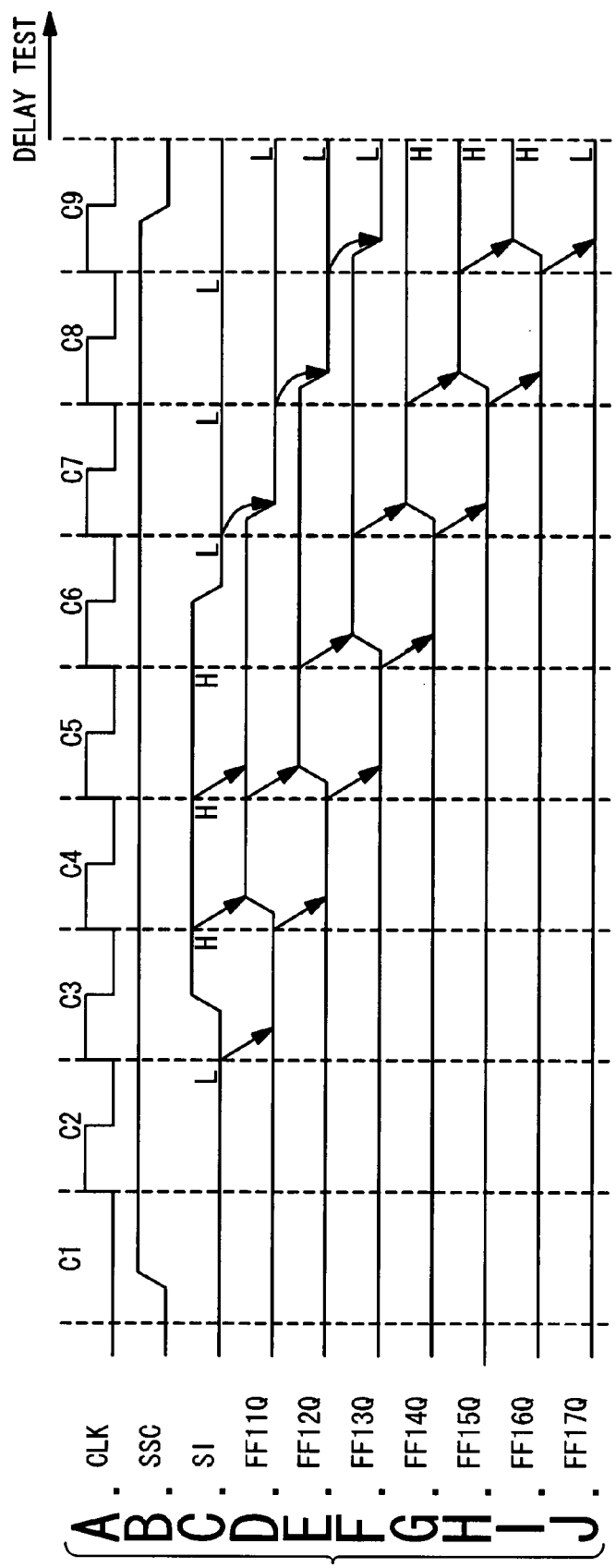
FIGS. 2A to 2J are timing chart showing an operation for setting a test data in the conventional delay fault testing circuit.
Figure 3:
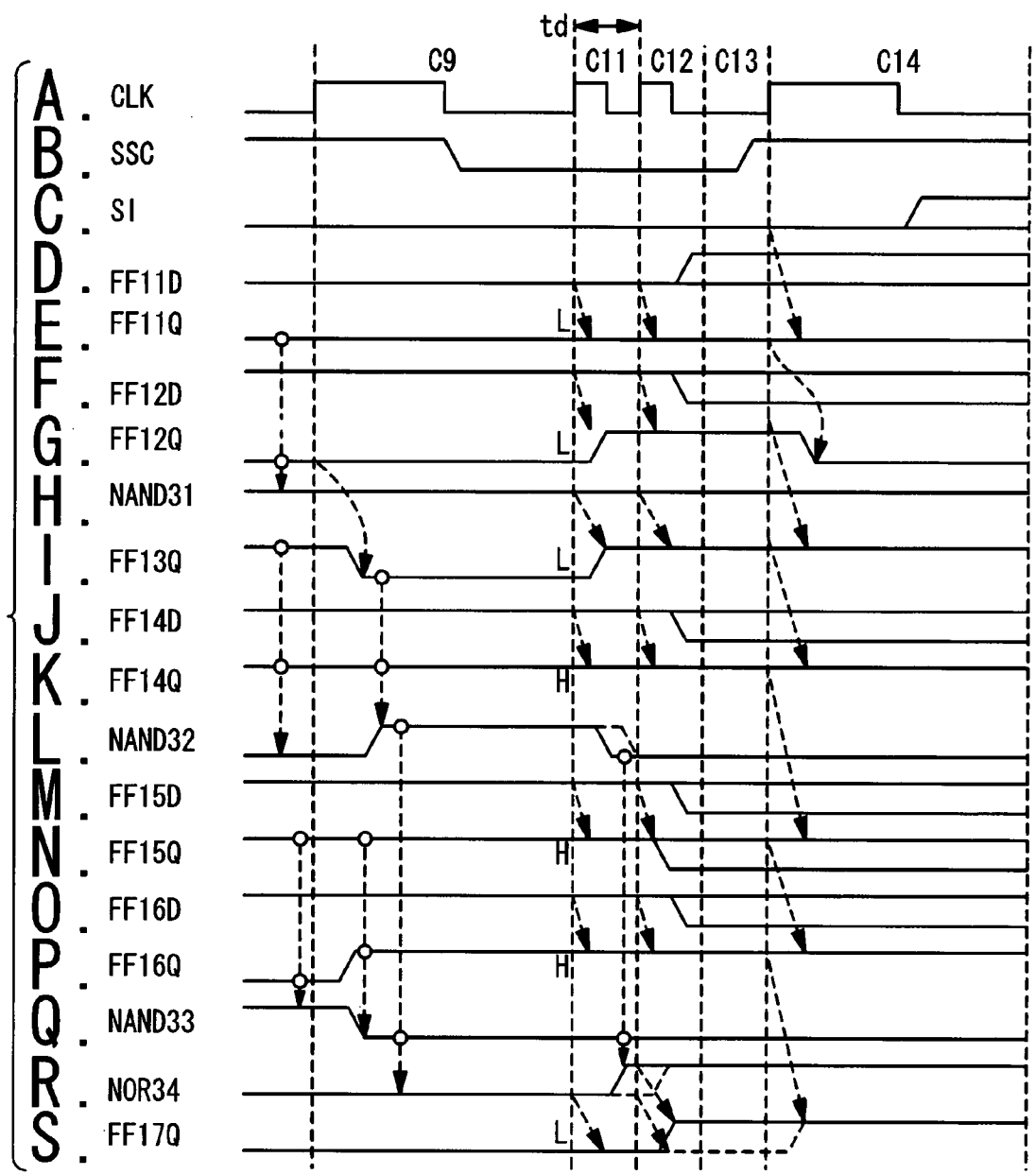
FIGS. 3A to 3S are timing charts showing the operation of the delay fault test in a same example.
Figure 4:
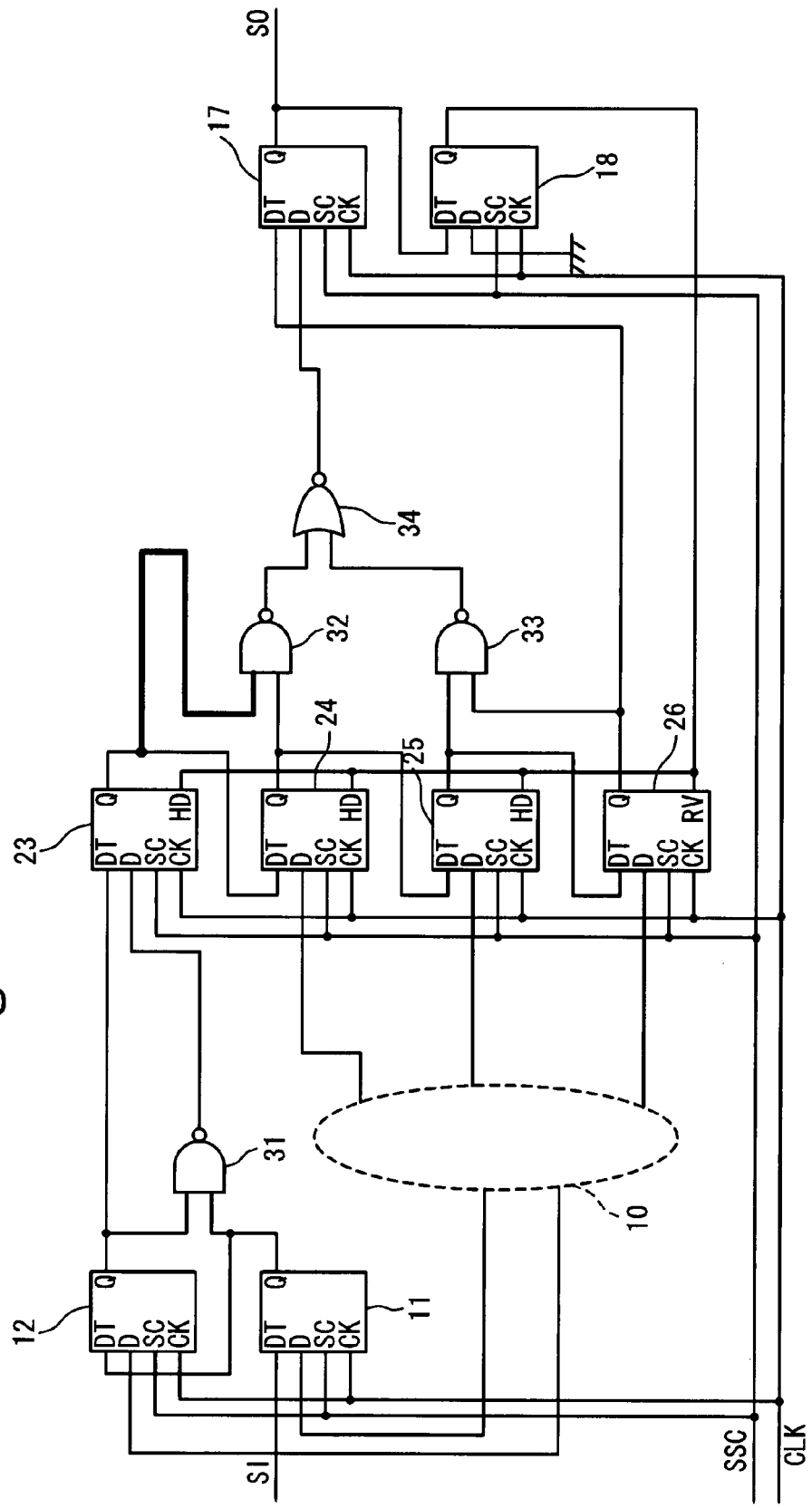
FIG. 4 is a circuit diagram showing an example of the conventional delay fault testing circuit example.
Figure 5:
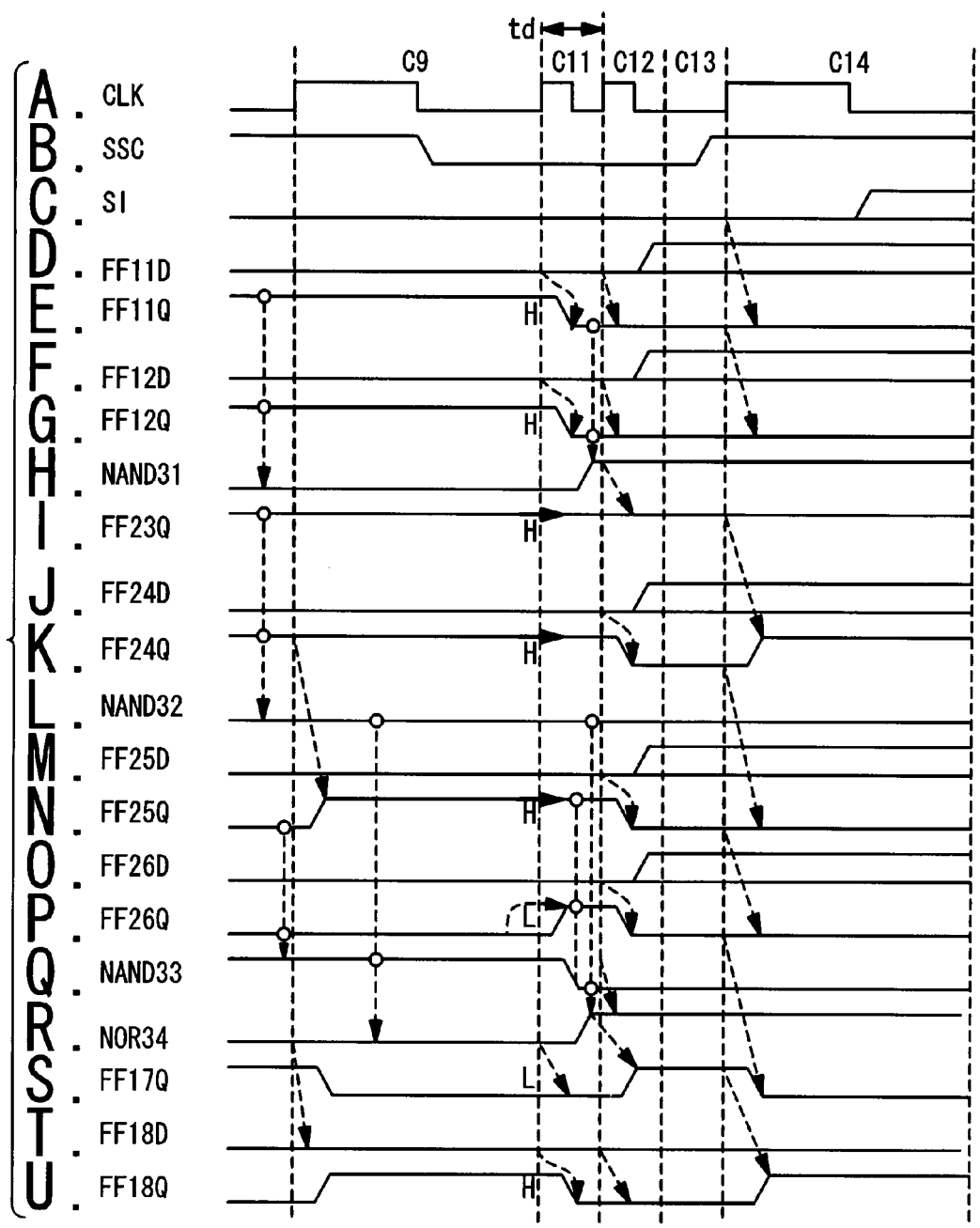
FIGS. 5A to 5U are timing charts showing the operation of the delay fault test in the same example.
Figure 6:
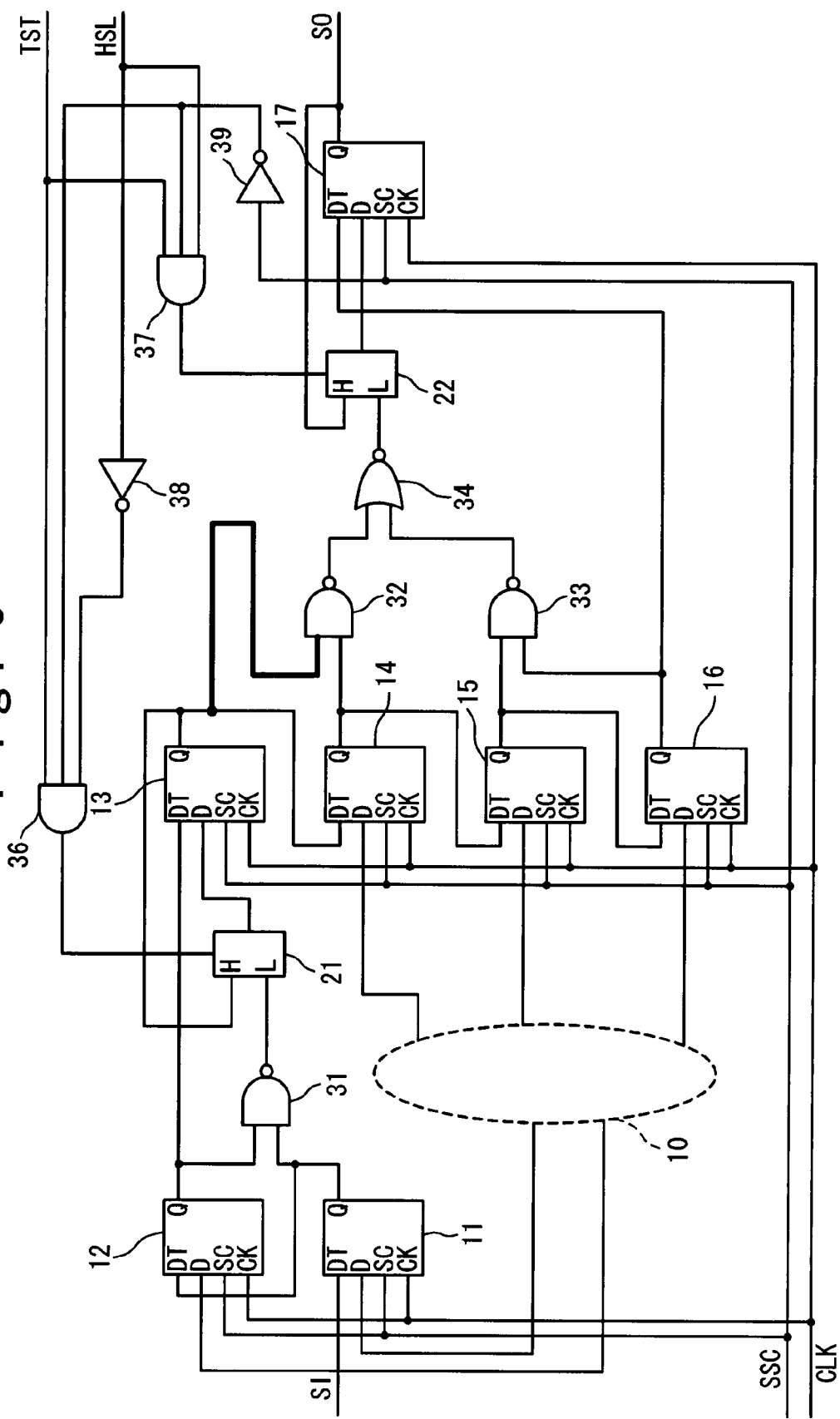
FIG. 6 is a circuit diagram showing a semiconductor integrated circuit device containing a delay fault testing circuit according to a first embodiment of the present invention.
Figure 13A:
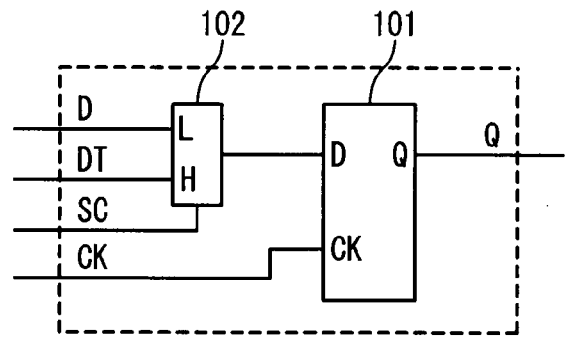
FIGS. 13A to 13C are circuit diagrams showing internal configuration examples of a flip-flop with a scan path test function.
Figure 13B:
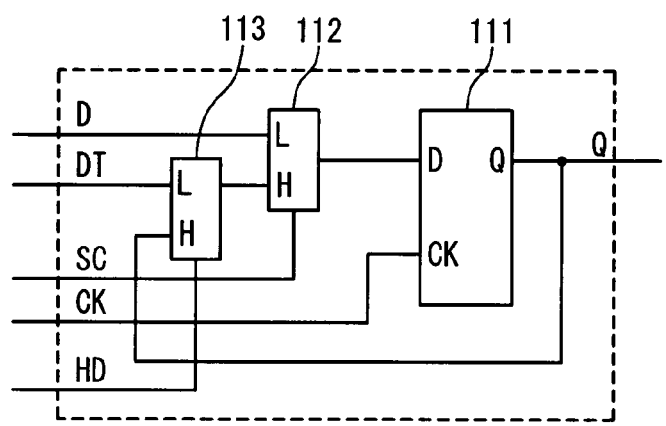
Figure 13C:
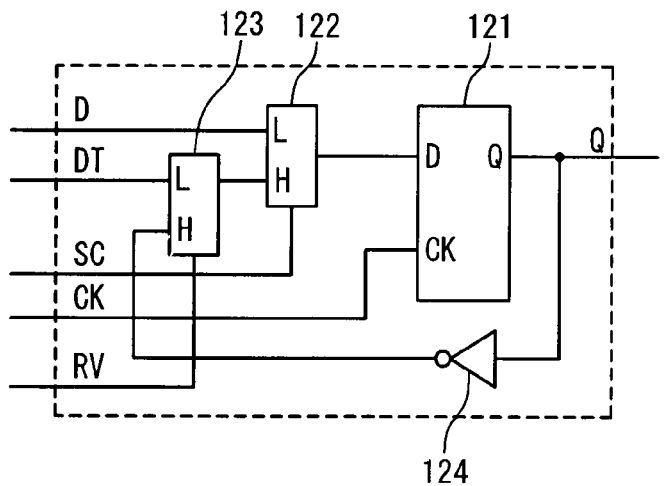

FIG. 6 shows the semiconductor integrated circuit device including a delay fault testing circuit according to the first embodiment of the present invention. Referring to FIG. 6, the delay fault testing circuit contains flip-flops 11 to 17 with a scan path test function, a combination circuit 10, selecting circuits 21 and 22, NAND circuits 31 to 33, a NOR circuit 34, AND circuits 36 and 37 and inverter circuits 38 and 39. Each of the flip-flops 11 to 17 does not have a data holding function, as shown in FIGS. 13A to 13C. Hereinafter, the flip-flops 11 to 17 with the scan path test function are simply referred to as the flip-flops 11 to 17.

In each of the flip-flops 11 to 17, a clock signal CLK is sent to a clock terminal CK, and a scan shift control signal SSC is sent to a scan shift control terminal SC. At the time of the scan path test, the flip-flops 11 to 17 form a scan path, and an output terminal Q of a former flip-flop is connected to a scan-in terminal DT of a current flip-flop. That is, a scan-in signal 5I is supplied to the scan-in terminal DT of the flip-flop 11 externally, and the output terminal Q of the flip-flop 11 is connected to the scan-in terminal DT of the next flip-flop 12. The output terminal Q of the flip-flop 12 is connected to the scan-in terminal DT of the flip-flop 13. The output terminal Q of the flip-flop 13 is connected to the scan-in terminal DT of the flip-flop 14. The output terminal Q of the flip-flop 14 is connected to the scan-in terminal DT of the flip-flop 15. The output terminal Q of the flip-flop 15 is connected to the scan-in terminal DT of the flip-flop 16. The output terminal Q of the flip-flop 16 is connected to the scan-in terminal DT of the flip-flop 17.

An input signal is sent from the combination circuit 10 to the data input terminals D of the flip-flops 11, 12 and 14 to 16. The two input terminals of the NAND circuit 31 are connected to the output terminals Q of the flip-flops 11 and 12, and the output terminal of the NAND circuit 31 is connected to one input terminal L of the selecting circuit 21. The other input terminal H of the selecting circuit 21 is connected to the output terminal Q of the flip-flop 13. The output terminal of the selecting circuit 21 is connected to the data input terminal D of the flip-flop 13, and the control terminal of the selecting circuit 21 is connected to the output of the AND circuit 36. The two input terminals of the NAND circuit 32 are connected to the output terminals Q of the flip-flops 13 and 14, and the output terminal of the NAND circuit 32 is connected to one input terminal of the NOR circuit 34. The two input terminals of the NAND circuit 33 are connected to the output terminals Q of the flip-flops 15 and 16, and the output terminal of the NAND circuit 33 is connected to the other input terminal of the NOR circuit 34. The output terminal of the NOR circuit 34 is connected to one input terminal L of the selecting circuit 22. The other input terminal H of the selecting circuit 22 is connected to the output terminal Q of the flip-flop 17. The output terminal of the selecting circuit 22 is connected to the data input terminal D of the flip-flop 17, and the control terminal of the selecting circuit 22 is connected to the output of the AND circuit 37. The AND circuit 37 receives a test execution signal TST that is supplied externally and indicates permission of the delay fault test using the scan path; a hold control signal HSL for controlling the selecting circuits 21 and 22; and the scan shift control signal SSC inverted by the inverter circuit 39, and outputs the result after the performance of a logic product, as a selection control signal, to the selecting circuit 22. The AND circuit 36 receives the test execution signal TST; the hold control signal HSL inverted by the inverter circuit 38; and the scan shift control signal SSC inverted through the inverter circuit 39, and outputs the result after the execution of the logic product, as the selection control signal, to the selecting circuit 21. At the time of the scan path test, a scan-out signal SO is outputted from the output terminal Q of the flip-flop 17 to outside.

A route from the flip-flop 13 to the flip-flop 17 serves as a timing exception path. The flip-flop 13 serves as a start point of the timing exception path, and the flip-flop 17 serves as an end point of the timing exception path. The flip-flops 13 and 17 have the paths where their own outputs are connected to the data input terminals D through the selecting circuits 21 and 22. Thus, when the selecting circuit 21 selects and outputs the output of the flip-flop 13, the flip-flop 13 is set to a lock state, and when the selecting circuit 22 selects and outputs the output of the flip-flop 17, the flip-flop 17 is set to the lock state. The selecting circuits 21 and 22 select the signals outputted from the AND circuits 36 and 37, respectively. The hold control signal HSL is inverted by the inverter circuit 38 and supplied to the AND circuit 36, and the hold control signal HSL is supplied in its original state to the AND circuit 37. Thus, when the selecting circuit 21 selects the output signal of the flip-flop 13, namely, when the flip-flop 13 is set to the lock state, the selecting circuit 22 selects the output of the NOR circuit 34. Therefore, the flip-flop 17 can latches the output of the combination circuit, and when the flip-flop 17 is set to the lock state, the flip-flop 13 can latches the output of the combination circuit.

Figure 7:
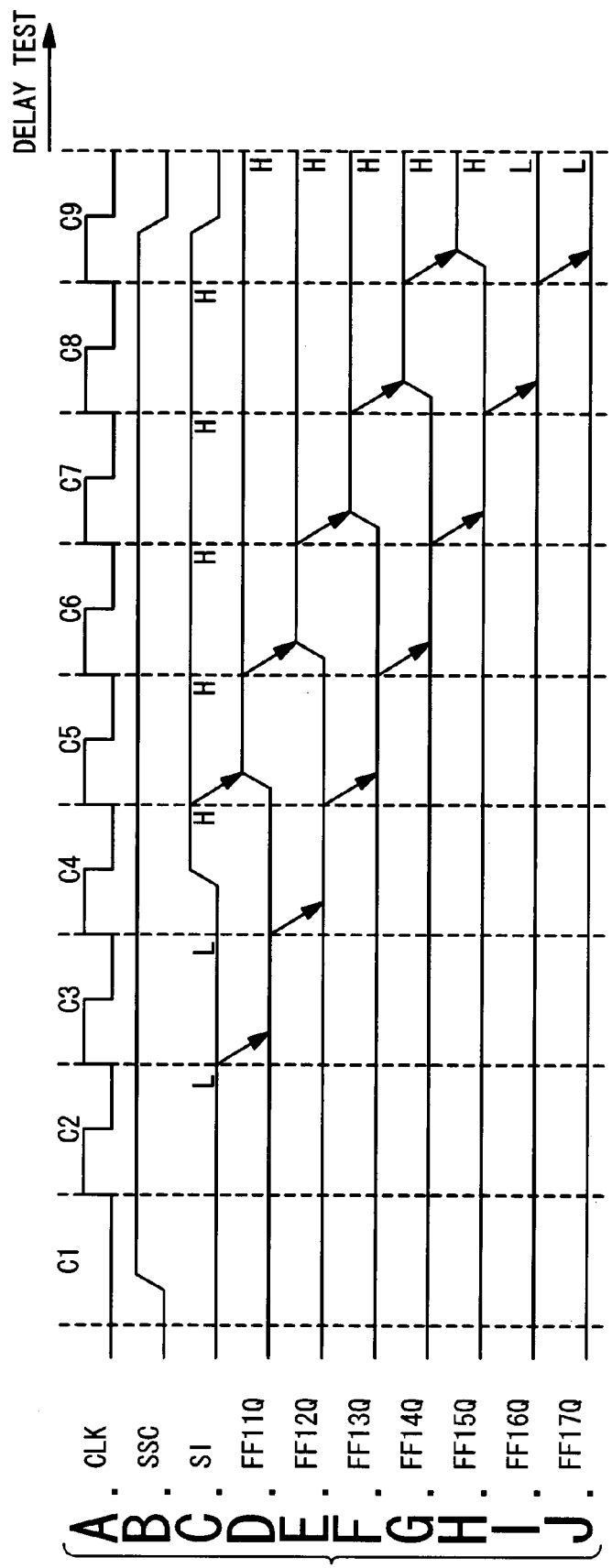
FIGS. 7A to 7J are timing charts showing an operation of the delay fault testing circuit according to the first embodiment of the present invention in setting a test data.

The operation of the circuit shown in FIG. 6 will be described below. FIGS. 7A to 7J are timing charts showing the operation for setting the test data to the respective flip-flops in order to perform the delay fault test by using the scan path. At a clock cycle C1, the scan shift control signal SSC becomes active (FIG. 7B), and the flip-flops 11 to 17 start to operate as a shift register for shifting the data in synchronization with the rising edge of the clock signal CLK. In the clock cycles C2 to C8, the data set to the shift-in signal 5I are sequentially sent to the flip-flops 11 to 17. Here, a data "LLH-HHHH" is set to the shift-in signal 5I (FIG. 7C). Thus, in the clock cycle C9, the flip-flops 11 to 17 are set to output "H", "H", "H", "H", "H", "L" and "L" from the respective output terminals Q (FIGS. 7D to 7J).

Figure 8:
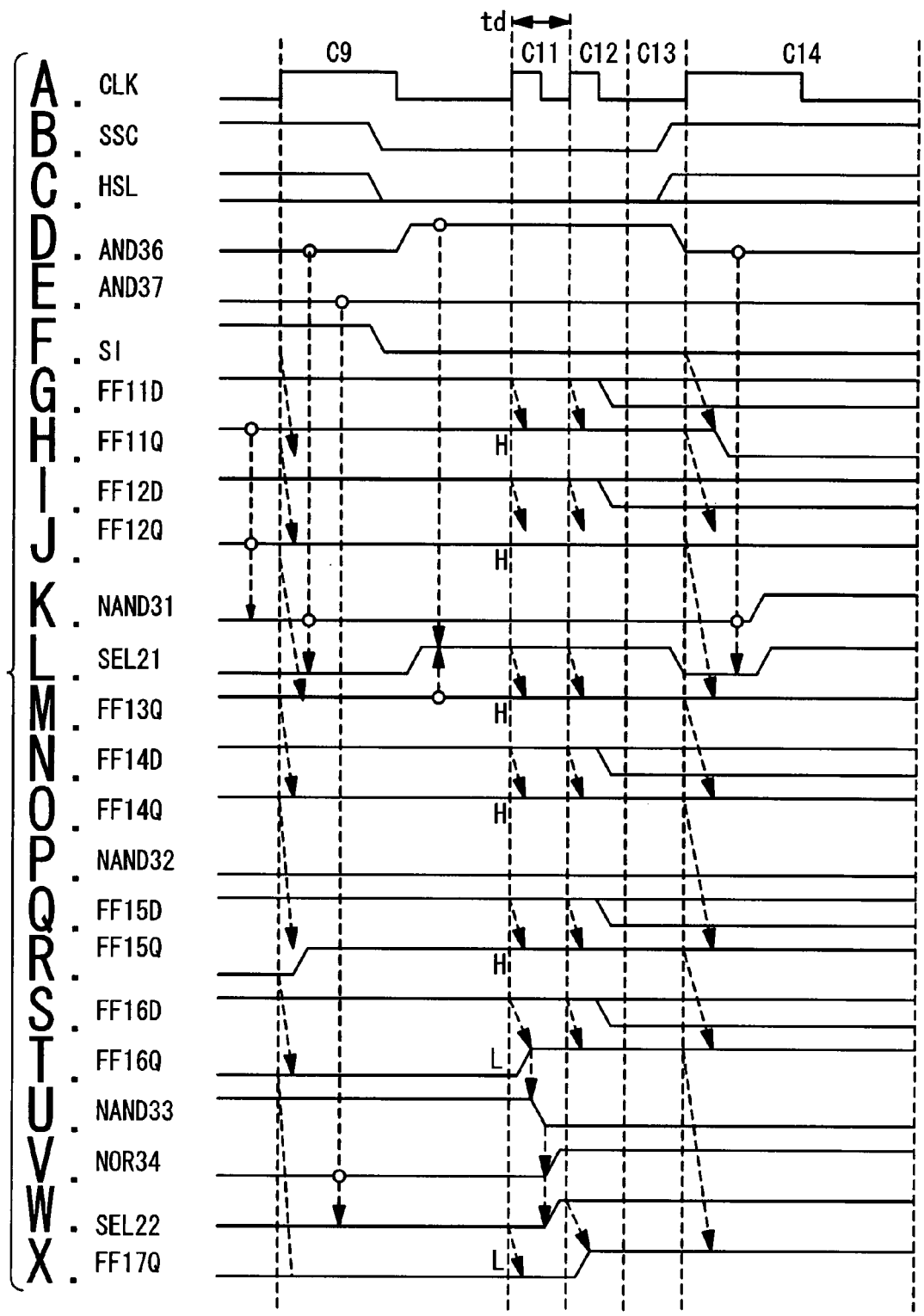
FIGS. 8A to 8X are timing charts showing the operation of the delay fault testing circuit according to the first embodiment of the present invention in testing a delay fault.

After that, as shown in FIGS. 8A to 8X, the delay fault test is performed. In FIGS. 8A to 8X, the time axis is enlarged. A delay time td during which the period of the clock cycle C11 is defined is indicated. That is, in synchronization with the rising edge of the clock cycle C11, each flip-flop latches the data supplied to the data input terminal D and outputs it. The outputted signal arrives at the flip-flop of the next stage through the combination circuit 10, and this is latched by each flip-flop in synchronization with the rising edge of the clock cycle C12. If the output of the combination circuit 10 does not arrive until the clock cycle C12, the generation of the delay fault is determined. Thus, the time td of the clock cycle C11 is set to satisfy a desirable test standard (FIG. 8A).

Since the test execution signal TST is always in "H" during this scan path test, it is not shown in the timing chart. The hold control signal HSL is a signal for controlling the signals to be selected by the selecting circuits 21 and 22. Here, they are in "L" in the clock cycle C9 in order to be kept in "L" during the period between the clock cycles C11 and C12 at least (FIG. 8C). Also, the scan shift control signal SSC is set to "L" in the clock cycle C9 after the completion of the shifting operation (FIG. 8B). Thus, the AND circuit 36 outputs "H", and the AND circuit 37 outputs "L" (FIGS. 8D and 8E). That is, during the period between the clock cycles C11 and C12, the selecting circuit 21 selects the output signal of the flip-flop 13, and the selecting circuit 22 selects the output signal of the NOR circuit 34.

In the clock cycle C9, the flip-flops 11 to 17 output "H", "H", "H", "H" "H", "L" and "L" from the output terminals Q, respectively. Thus, the output of the NAND circuit 31 is set to "L", the output of the NAND circuit 32 is set to "L", and the output of the NAND circuit 33 is set to "H" (FIGS. 8K, 8P and 8U). Thus, the NOR circuit 34 outputs "L" (FIG. 8V). Here, the scan shift control signal SSC is set to "L", and the flip-flops 11 to 17 are set to the states to latch the signals supplied to the data input terminals D, in synchronization with the clock signal CLK.

In the clock cycle C11, in synchronization with the rising edge of the clock signal CLK, the flip-flops 11 to 17 latch the signals supplied to the data input terminals D. The flip-flops 11, 12 and 14 to 16 latch "H" outputted from the combination circuit 10, and the output of only the flip-flop 16 is changed from "L" to "H" (FIGS. 8H, 8J, 8O, 8R and 8T). The flip-flop 13 latches its own output signal outputted by the selecting circuit 21. Thus, at the time of this delay fault test (the clock cycles C11 and C12), the flip-flop 13 is in the lock state (FIG. 8M). The flip-flop 17 latches the output signal of the NOR circuit 34 outputted by the selecting circuit 22 (FIG. 8X).

Since the output of the flip-flop 16 is changed from "L" to "H", the output of the NAND circuit 33 is changed from "H" to "L" (FIG. 8U). Since the output of the NAND circuit 33 is changed from "H" to "L", the output of the NOR circuit 34 is changed from "L" to "H" (FIG. 8V). Thus, in the clock cycle C11, the output of the selecting circuit 22 is changed from "L" to "H" (FIG. 8W).

At the clock cycle C12, in synchronization with the rising edge of the clock signal CLK, the flip-flops 11 to 17 latch the signals to be supplied to the data input terminals D. That is, the result of the delay fault test is latched by each flip-flop. The flip-flop 17 latches the result of the delay fault test of the route from the flip-flop 16 through the NAND circuit 33 and the NOR circuit 34 and the selecting circuit 22 to the flip-flop 17. Until the rising edge of the clock cycle C12, the change of the signal is attained, which implies that there is no delay fault.

At the clock cycle C13, the scan shift control signal SSC is set to "H". Then, the flip-flops 11 to 17 form the shift register and carry out the shifting operation. On and after the clock cycle C14, the states held in the flip-flops 11 to 17 are outputted from the external terminals of the LSI, and the test results are determined.

In this way, between the clock cycles C10 and C11, the hold control signal HSL is set to "L". Then, the flip-flop 13 is in the lock state. Thus, the output signal of the flip-flop 13 has no influence on this delay fault test. On the other hand, the flip-flop 17 is in the state in which the output signal of the NOR circuit 34 can be latched. Thus, if the hold control signal HSL is in "L", without any influence of the output signal of the flip-flop 13, it is possible to carry out the delay fault test of the different route with the flip-flop 17 as the final flip-flop.

Figure 9:
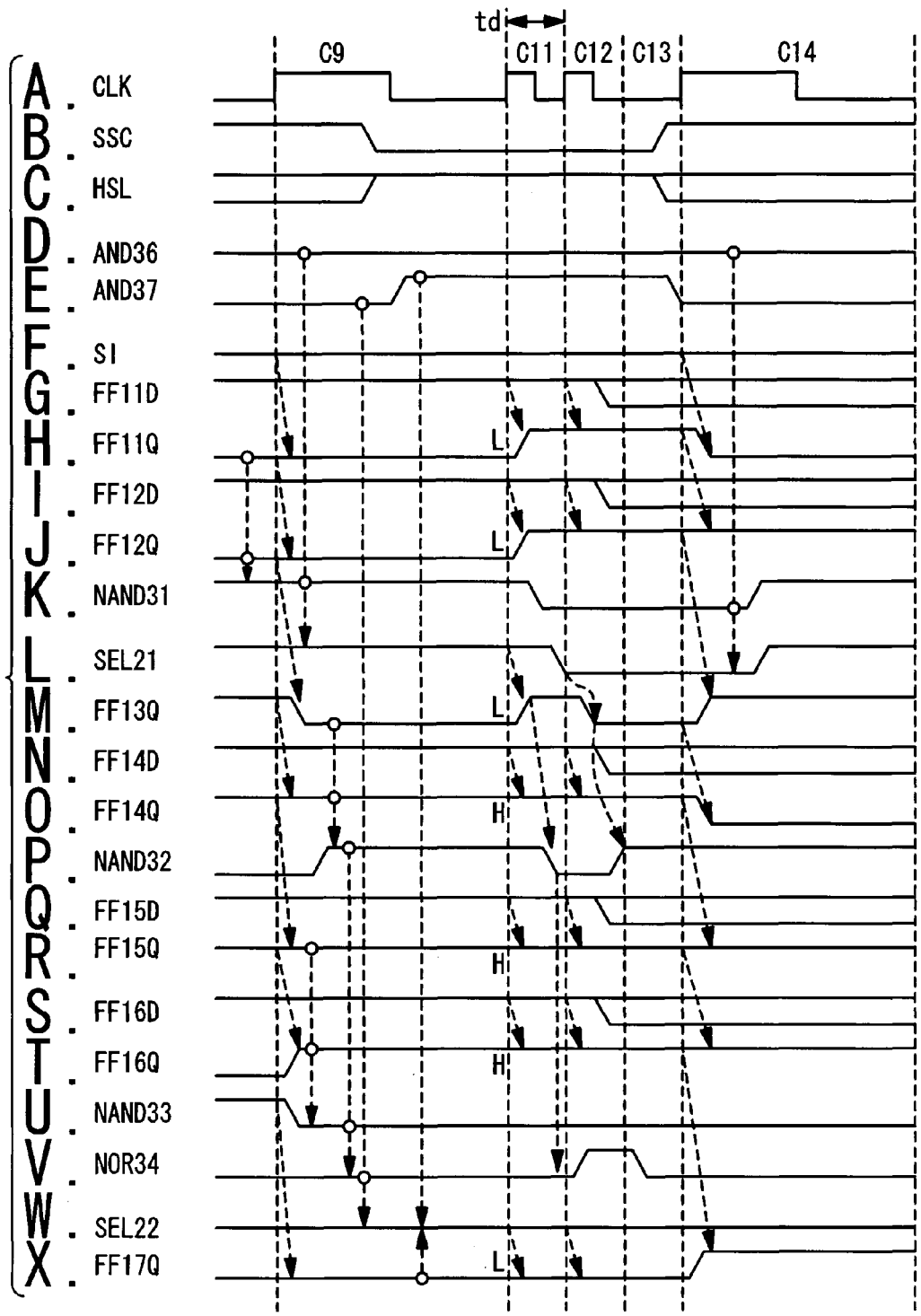
FIGS. 9A to 9X are timing charts showing the operation of the delay fault testing circuit according to the first embodiment of the present invention in testing the delay fault.

FIGS. 9A to 9X are timing charts showing the operation of the semiconductor integrated circuit device when the hold control signal HSL is in "H". An operation for setting the test data to the flip-flops 11 to 17 is same as that of FIGS. 7A to 7J, and only the data content is different. Thus, their explanations are omitted. Here, as the shift-in signal 5I, the test data "LHHHLLL" is inputted. At the clock cycle C9, "L", "L", "L", "H", "H", "H" and "L" are set to the flip-flops 11 to 17, respectively (FIGS. 9F, 9H, 9J, 9M, 9O, 9R, 9T and 9X).

Thus, in the clock cycle C9, the NAND circuit 31 outputs "H", the NAND circuit 32 outputs "H", and the NAND circuit 33 outputs "L" (FIGS. 9K, 9P and 9U). In response to this, the NOR circuit 34 outputs "L" (FIG. 9V). Here, the scan shift control signal SSC is set to "L" (FIG. 9B). Then, the flip-flops 11 to 17 are set to the state to latch the signals to be supplied to the data input terminals D in synchronization with the clock signal CLK. Also, the hold control signal HSL is set to H (FIG. 9C), and the AND circuit 36 outputs "L", and the AND circuit 37 outputs "H" (FIGS. 9D, 9E) and controls the selecting circuits 21 and 22. Thus, the flip-flop 17 is set to the lock state in which the output is not changed. Then, in the flip-flop 13, in accordance with the output signal of the NAND circuit 31 in synchronization with the rising edge of the clock signal CLK, the output is changed.

In the clock cycle C11, in synchronization with the rising edge of the clock signal CLK, the flip-flops 11 to 17 latch the signals to be supplied to the data input terminals D. The flip-flops 11 to 13 latch the "H" signals supplied to the data input terminals D. Then, their outputs are changed to "H" (FIGS. 9H, 9J and 9M). Since the outputs of the flip-flops 11, 12 are changed to "H", the output of the NAND circuit 31 is changed to "L" (FIG. 9K) and supplied through the selecting circuit 21 to the data input terminal D of the flip-flop 13.

In the clock cycle C12, in synchronization with the rising edge of the clock signal CLK, the flip-flops 11 to 17 latch the signals supplied to the data input terminals D. That is, the result of the delay fault test is latched by each flip-flop. Since the output signals of the flip-flops 11 and 12 are changed, the input signal of the flip-flop 13 is changed. Then, the flip-flop 13 latches the result of the delay fault test to the route having the flip-flops 11 as start flip-flop.

On the other hand, in the clock cycle C11, since the output of the flip-flop 13 is changed to "H", the output of the NAND circuit 32 is changed to "L" (FIG. 9P). This route from the flip-flop 13 to the NAND circuit 32 is, for example, the timing exception path in which a connection wiring length is long and a wiring delay is severe. In association with the change in the output of the NAND circuit 32, the output of the NOR circuit 34 is changed to "H" (FIG. 9V). At this time, this is already in the period of the clock cycle C12. Thus, it is determined to be the fault in the delay fault test with the delay time td as a test standard. Since the selecting circuit 22 does not select the output of this NOR circuit 34 (FIG. 9W), this route is not targeted for the delay fault test.

In the clock cycle C13, the scan shift control signal SSC is set to "H". Then, the flip-flops 11 to 17 form the shift register and carry out the shifting operation. On and after the clock cycle C14, the states held in the flip-flops 11 to 17 are outputted from the external terminals of the LSI, and the test results are determined.

In this way, between the clock cycles C10 and C11, the hold control signal HSL is set to "H". Then, the flip-flop 17 is in the lock state. Thus, the flip-flop 17 does not receive any influence of the output signal of the NOR circuit 34. That is, the delay fault test of the timing exception path can be avoided. At this time, it could be understood to be able to carry out the delay fault test of the different route in which the flip-flop 13 serving as a start flip-flop of the timing exception path is defined as a final flip-flop, without any influence thereof. Also, when in the route with the flip-flop 13 as the start flip-flop, there is any different route that is not the timing exception path, it is naturally possible to carry out the delay fault test of that route.

In this way, when the hold control signal HSL is in "L", it is possible to carry out the delay fault test of all the routes in which the start flip-flop of the timing exception path is not defined as the start point. Also, when the hold control signal HSL is in "H", it is possible to carry out the delay fault test of all the routes in which the final flip-flop of the timing exception path is not defined as the final point. That is, in this way, since the selecting circuits 21 and 22 are inserted into the former stages of the start and final flip-flops of the timing exception path and they are controlled, it is possible to avoid the delay fault test targeted to the timing exception path and consequently possible to carry out the delay fault test without any decrease in the delay fault detection rate.

In this way, the final flip-flop of the timing exception path does not receive any influence of the state of the timing exception path. Therefore, when the ATPG program is executed and the test pattern is generated, a mask setting is not required to be performed on the output of the flip-flop 17.

Also, as indicated in the clock cycle C1, in the clock cycle while the clock of the test standard condition is supplied, even if the latch operation of the start flip-flop of the timing exception path is not always made effective, the operation state that can be latched can be generated in response to the hold control signal. For this reason, it is also possible to carry out the delay fault test of the path from the former stage flip-flop of the start flip-flop of the timing exception path to the start flip-flop of the timing exception path.

Second Embodiment

Figure 10:
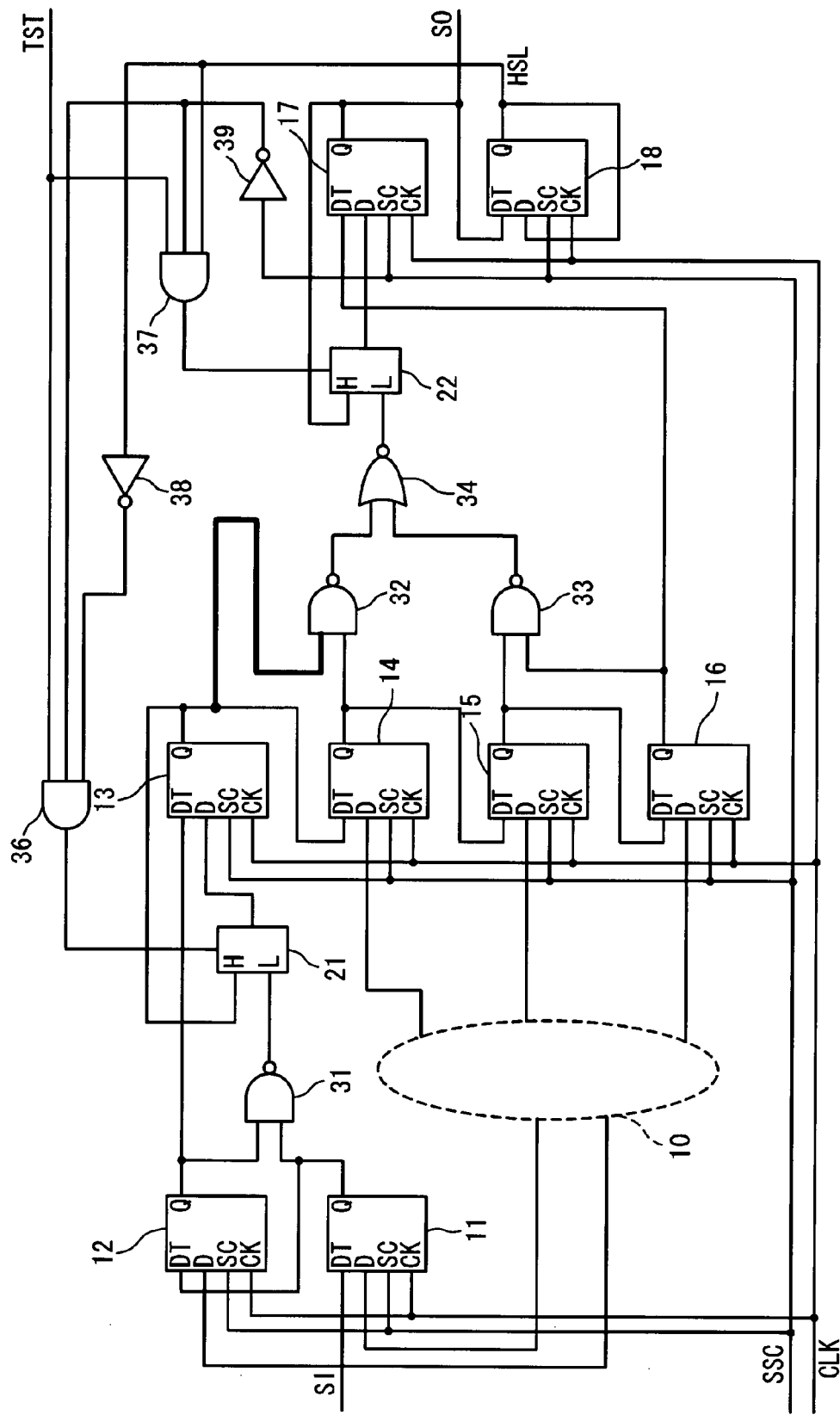
FIG. 10 is a circuit diagram showing the semiconductor integrated circuit device containing the delay fault testing circuit according to a second embodiment of the present invention.
Figure 11:
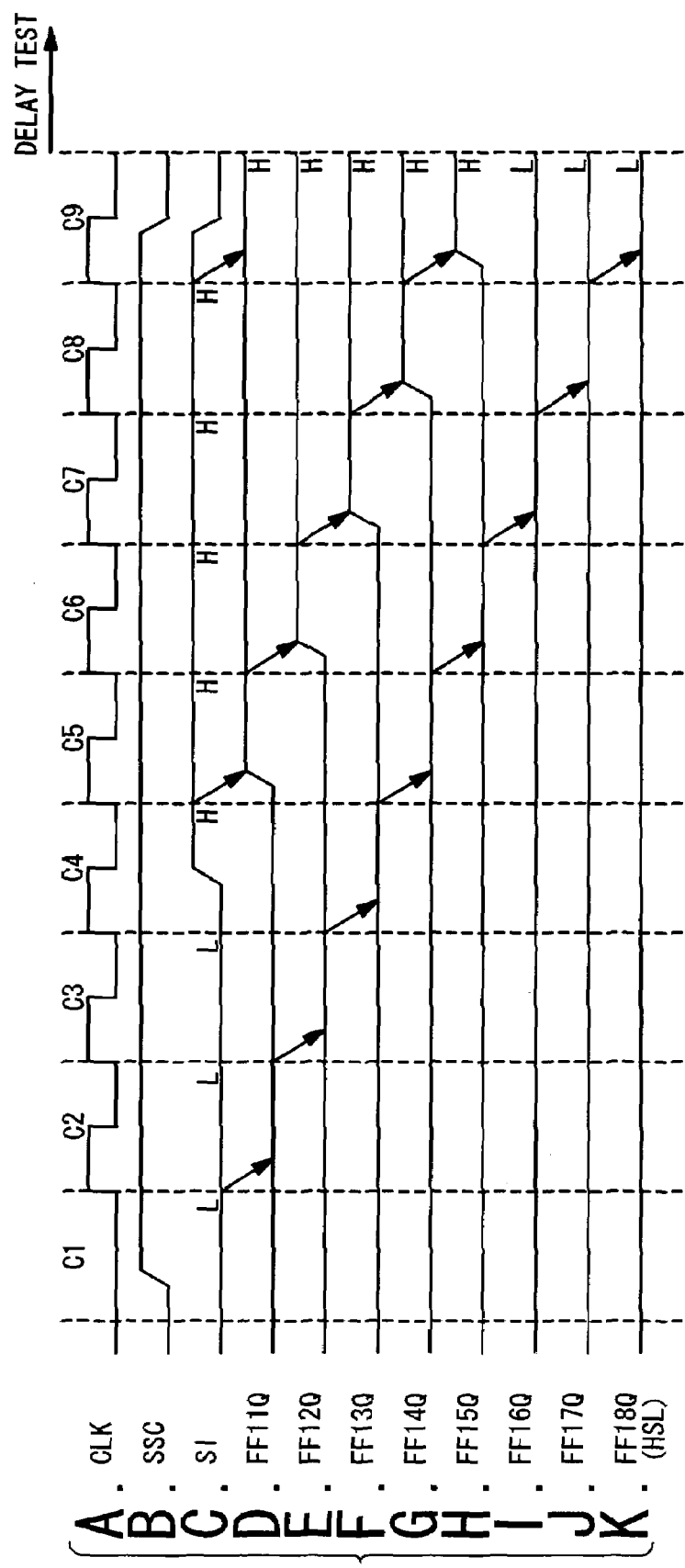
FIGS. 11A to 11K are timing charts showing an operation of the delay fault testing circuit according to the second embodiment of the present invention in setting the test data.

FIG. 10 shows the semiconductor integrated circuit device of a delay fault testing circuit according to the second embodiment of the present invention. In this delay fault testing circuit, the hold control signal HSL is generated by the flip-flop 18. Then, the output of the flip-flop 18 is set as the test data through the scan path externally. Thus, in the delay fault testing circuit shown in FIG. 10, the flip-flop 18 is added to the delay fault testing circuit shown in FIG. 6, and its output signal is sent as the hold control signal HSL to each section. The scan-in terminal DT of the flip-flop 18 is connected to the output terminal Q of the flip-flop 17, and the data input terminal D is connected to its own output terminal Q. The clock signal CLK is sent to the clock terminal CK, and the scan shift control signal SSC is sent to the scan shift control terminal SC. Therefore, the flip-flop 18 is connected to be added to the final portion of the scan path composed of the flip-flops 11 to 17. However, it may be inserted into a different position. The components other than the flip-flop 18 are similar to those of FIG. 6. Thus, its explanation is omitted.

Also, with regard to the operation, a desirable data is set in the clock cycle C9, and that data may be held between the delay fault test periods C11 and C12. The operation of the delay fault test is similar to that of the first embodiment. Since the flip-flop 18 with the scan path test function is added, the operation for setting the test data to the flip-flops 11 to 18 are different. Thus, the operation for setting the test data will be described below with reference to FIGS. 11A to 11K and FIGS. 12A to 12K.

FIGS. 11A to 11K are timing charts showing an example of the operation for setting the test data when the hold control signal HSL is set to "L" between the delay fault test periods C11 and C12. Since the flip-flop 18 is added, the data setting is increased by one clock cycle. Here, in the clock cycle C1, the scan shift control signal SSC becomes active, and a first scan-in data is supplied. The operation for setting the test data is the operation of the simple shift register. Thus, the data set for the scan-in signal SI in the clock cycles C1 to C8 are set for the flip-flops 18 to 11 in the clock cycle C9.

Here, as for the set data, "H" is set to the flip-flop 11, "H" is set to the flip-flop 12, "H" is set to the flip-flop 13, "H" is set to the flip-flop 14, "H" is set to the flip-flop 15, "L" is set to the flip-flop 16, and "L" is set to the flip-flop 17. Thus, they are the same data as the case of the delay fault test shown in FIGS. 8A to 8X. It is also possible to set the data "L" to the flip-flop 18 and also set the hold control signal HSL shown in FIG. 8C to "L".

After that, in the clock cycles C11 and C12, when the clock signal CLK rises, its own output terminal Q is connected to the data input terminal D in the flip-flop 18. Thus, the state is not changed, and the output signal HSL keeps "L". In the clock cycle C13, when the scan shift control signal SSC is set to "H", the flip-flop 18 operates to latch the output signal of the flip-flop 17 in synchronization with the clock signal CLK. Thus, differently from the hold control signal HSL shown in FIG. 8C, the output signal of the flip-flop 18 is varied in accordance with the test data. However, in the AND circuits 36 and 37, the scan shift control signal SSC is inverted by the inverter circuit 39 and supplied thereto. Therefore, the control signals to the selecting circuits 21 and 22 become same.

FIGS. 12A to 12K are timing charts showing an example of the operation for setting the test data when the hold control signal HSL is set to "H" between the delay fault test period C11 and C12. Only with the fact that the data set to the scan-in signal SI in the clock cycle C1 is changed to "H", the output signal of the flip-flop 18 in the clock cycles C9 to C13 is set to "H". Naturally, the data set in the clock cycles C2 to C8 can be freely set on the basis of the test content.

In this way, through the addition of the flip-flop, it is possible to superimpose the hold control signal HSL on the scan-in signal. Thus, the number of the terminals connected to the outside can be reduced.

As mentioned above, according to the present invention, in the delay fault test of the LSI that uses the scan path circuit, especially, in the delay fault test that uses the test pattern generated in accordance with the transition delay fault model, it is possible to protect the decrease in the delay fault detection rate, which is caused by the influence of the timing exception path.

What is claimed is:

1. A semiconductor integrated circuit device comprising:
a plurality of flip-flops configured to form a scan chain in a scan path test to operate as a shift register;
wherein a first flip-flop of said plurality of flip-flops latches a first input signal in synchronization with a clock signal, outputs a first output signal and fixes a signal level of the first output signal regardless of changing a signal level of a first signal flowing in a first signal route from an output of a third flip-flop of said plurality of flip-flops to an input of said first flip-flop based on a first selection control signal;
wherein a second flip-flop of said plurality of flip-flops latches a second input signal in synchronization with the clock signal, outputs a second output signal, and fixes a signal level of the second output signal regardless of changing a signal level of a second signal flowing in a second signal route from an output of a fourth flip-flop of said plurality of flip-flops to an input of said second flip-flop, based on a second selection control signal; and
a control circuit configured to generate the first and second selection control signals such that a period during which said first flip-flop fixes the signal level of the first output signal is different from a period during which said second flip-flop fixes the signal level of the second output signal.

2. A semiconductor integrated circuit device comprising:
a plurality of flip-flops configured to form a scan chain in a scan path test to operate as a shift register;
wherein a first flip-flop of said plurality of flip-flops latches a first input signal in synchronization with a clock signal, outputs a first output signal and fixes the first output signal based on the first selection control signal;
wherein a second flip-flop of said plurality of flip-flops latches a second input signal in synchronization with the clock signal, outputs a second output signal, and fixes the second output signal based on a second selection control signal;
a control circuit configured to generate the first and second selection control signals such that a period during which said first flip-flop fixes the first output signal is different from a period during which said second flip-flop fixes the second output signal;

a first selecting circuit configured to select one of the first output signal and a first combination signal outputted from a combination circuit based on the first selection control signal and to output the selected signal to said first flip-flop as the first input signal; and a second selecting circuit configured to select one of the second output signal and a second combination signal outputted from said combination circuit based on the second selection control signal and to output the selected signal to said second flip-flop as the second input signal.

3. The semiconductor integrated circuit device according to claim 2, wherein a signal route from an output of said first flip-flop to an input of said second flip-flop is a timing exception path which is not necessary for a delay time to fall within a one clock cycle of the clock signal.

4. The semiconductor integrated circuit device according to claim 2, wherein said control circuit generates the first and second selection control signals based on a test execution signal indicating that a delay fault test is executed to detect a delay fault.

5. The semiconductor integrated circuit device according to claim 2, wherein said control circuit determines whether said first flip-flop inputs the first output signal or said second flip-flop inputs the second output signal, based on an external hold control signal, and generates the first and second selection control signal.

6. The semiconductor integrated circuit device according to claim 5, wherein said scan chain of said plurality of flip-flops comprises a third flip-flop configured to output the hold control signal.

7. The semiconductor integrated circuit device according to claim 6, wherein a test data supplied to said scan chain is set in said third flip-flop and contains a data showing the hold control signal.

8. A delay fault test method comprising:

forming a scan chain from a plurality of flip-flops in a scan path test to operate as a shift register;

holding a first output signal of a first flip-flop of said plurality of flip-flops in response to a first selection control signal;

holding a second output signal of a second flip-flop of said plurality of flip-flops in response to a second selection control signal; and generating the first and second selection control signals such that a period during which said first flip-flop fixes the first output signal is different from a period during which said second flip-flop fixes the second output signal, wherein a delay fault is tested by supplying a test data to said scan chain.

9. The delay fault test method according to claim 8, wherein said plurality of flip-flops operate in synchronization with a clock signal, said delay fault test method further comprises:

setting a start point flip-flop of a timing exception path in a signal route set to said plurality of flip-flops to said first flip-flop;

wherein the timing exception path is not necessary for a delay time when a signal is transferred on said signal route to fall within one clock cycle of the clock signal; and setting an end point flip-flop of the timing exception path to said second flip-flop.

10. The delay fault test method according to claim 8, wherein said generating the first and second selection control signals comprises:

generating the first and second selection control signals based on a test execution signal indicating that a delay fault test is executed to detect a delay fault.

11. The delay fault test method according to claim 8, wherein said generating the first and second selection control signals comprises:

validating the first selection control signal or the second selection control signal based on a hold control signal.

12. The delay fault test method according to claim 8, wherein said generating the first and second selection control signals comprises:

validating the first selection control signal or the second selection control signal based on the test data.

* * * * *